United States Patent
Oh et al.

(10) Patent No.: US 10,868,089 B2
(45) Date of Patent: Dec. 15, 2020

(54) DISPLAY DEVICE

(71) Applicant: Samsung Display Co., Ltd., Yongin-si (KR)

(72) Inventors: Jaehwan Oh, Yongin-si (KR); Jinoh Kwag, Yongin-si (KR); Deokhoi Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/130,590

(22) Filed: Sep. 13, 2018

(65) Prior Publication Data

US 2019/0081118 A1 Mar. 14, 2019

(30) Foreign Application Priority Data

Sep. 14, 2017 (KR) .................. 10-2017-0117750

(51) Int. Cl.
*H01L 27/32* (2006.01)
*H01L 51/52* (2006.01)
*H01L 51/00* (2006.01)

(52) U.S. Cl.
CPC ........ *H01L 27/3246* (2013.01); *H01L 27/326* (2013.01); *H01L 27/3237* (2013.01); *H01L 27/3258* (2013.01); *H01L 27/3276* (2013.01); *H01L 51/0096* (2013.01); *H01L 51/525* (2013.01); *H01L 51/5253* (2013.01); *H01L 27/3225* (2013.01); *H01L 27/3227* (2013.01)

(58) Field of Classification Search
CPC ............. H01L 27/3246; H01L 27/3237; H01L 27/3258; H01L 27/326; H01L 27/3276
See application file for complete search history.

(56) References Cited

U.S. PATENT DOCUMENTS

| 8,947,627 | B2 | 2/2015 | Rappoport et al. | |
|---|---|---|---|---|
| 9,105,871 | B2 | 8/2015 | Hamm | |
| 9,543,364 | B2 | 1/2017 | Rappoport et al. | |
| 9,780,157 | B2* | 10/2017 | Kwon | H01L 27/124 |
| 2004/0218127 | A1* | 11/2004 | Miura | G02F 1/1333 |
| | | | | 349/122 |
| 2007/0114530 | A1* | 5/2007 | Kimura | G09G 3/3225 |
| | | | | 257/59 |
| 2009/0181226 | A1* | 7/2009 | Ning | H05K 3/1258 |
| | | | | 428/209 |
| 2012/0112197 | A1* | 5/2012 | Yoshida | G02F 1/13458 |
| | | | | 257/59 |
| 2013/0009162 | A1* | 1/2013 | Kang | H01L 27/3246 |
| | | | | 257/72 |
| 2014/0354142 | A1* | 12/2014 | Jeong | H01L 27/3246 |
| | | | | 313/506 |

(Continued)

FOREIGN PATENT DOCUMENTS

| JP | 2006-59582 A | 3/2006 |
|---|---|---|
| KR | 10-2017-0002730 A | 1/2017 |
| KR | 10-2017-0019553 A | 2/2017 |

*Primary Examiner* — Sejoon Ahn

(74) *Attorney, Agent, or Firm* — Lewis Roca Rothgerber Christie LLP

(57) ABSTRACT

A display device includes: a substrate; a plurality of pixels on the substrate, the plurality of pixels being around a first area and at least partially surrounding the first area; a light-transmissive wire on the substrate and overlapping the first area; and an encapsulation member covering the plurality of pixels.

15 Claims, 12 Drawing Sheets

(56) References Cited

U.S. PATENT DOCUMENTS

| | | | |
|---|---|---|---|
| 2016/0147375 A1* | 5/2016 | Bok | G06F 3/0421 |
| | | | 345/175 |
| 2016/0380038 A1 | 12/2016 | Kang et al. | |
| 2017/0047544 A1 | 2/2017 | Kang et al. | |
| 2017/0220185 A1* | 8/2017 | Kurasawa | G02F 1/13306 |
| 2017/0263889 A1* | 9/2017 | Seki | H01L 51/0097 |

* cited by examiner

DISPLAY DEVICE

CROSS-REFERENCE TO RELATED APPLICATION

This application claims priority to and the benefit of Korean Patent Application No. 10-2017-0117750, filed on Sep. 14, 2017, in the Korean Intellectual Property Office, the disclosure of which is incorporated herein in its entirety by reference.

BACKGROUND

1. Field

One or more embodiments relate to a display device.

2. Description of the Related Art

Display devices have been used for a variety of purposes. As display devices have become thinner and lighter, the range of use thereof has widened.

As display devices have been used for various reasons, various methods may be used to manufacture display devices. Also, functions which may be integrated with or applied to display devices have increased.

SUMMARY

One or more embodiments include a display device including a first area in a display area, wherein an electronic component such as a camera, a sensor, etc. may overlap the first area.

Additional aspects will be set forth in part in the description which follows and, in part, will be apparent from the description, or may be learned by practice of the presented embodiments.

According to one or more embodiments, a display device includes: a substrate; a plurality of pixels on the substrate, the plurality of pixels being disposed around a first area and at least partially surrounding the first area; a light-transmissive wire disposed on the substrate and overlapping the first area; and an encapsulation member covering the plurality of pixels.

The plurality of pixels may include a first pixel and a second pixel spaced apart from each other with the first area therebetween. The first pixel may include a first thin film transistor (TFT) and a first line connected to the first TFT, and the second pixel may include a second TFT and a second line connected to the second TFT. The wire may electrically connect the first line with the second line.

The display device may further include at least one insulating layer interposed between the first line and the wire, and the first line and the wire may be connected to each other via a contact hole penetrating the at least one insulating layer.

A thickness of the wire may be less than a thickness of at least one of the first line or the second line.

A width of the wire may be greater than a width of at least one of the first line or the second line.

The first line and the second line may be a scan line, a data line, or a driving voltage line.

The encapsulation member may include a glass substrate.

The encapsulation member may include at least one inorganic insulating layer and at least one organic insulating layer.

According to one or more embodiments, a display device includes: a substrate; a circuit layer disposed on the substrate and comprising a plurality of thin film transistors (TFTs) and a plurality of lines electrically connected to the plurality of TFTs; an array including a plurality of display elements and disposed on the circuit layer; and an encapsulation member covering the array, wherein the array includes a first area, and the plurality of display elements are disposed adjacent to the first area so as to at least partially surround the first area, and the circuit layer includes a wire overlapping the first area.

The wire may be light-transmissive.

The plurality of display elements may include a first display element and a second display element spaced apart from each other with the first area therebetween, and the wire may electrically connect a first line of the first display element with a second line of the second display element.

A thickness of the wire may be less than a thickness of at least one of the first line or the second line.

A width of the wire may be greater than a width of at least one of the first line or the second line.

Each of the plurality of display elements may include: a pixel electrode on the circuit layer; a pixel-defining layer having an opening exposing the pixel electrode; an emission layer on the pixel electrode; and an opposite electrode on the emission layer.

The pixel-defining layer may have a hole corresponding to the first area.

The opposite electrode may be formed as one body so as to correspond to the plurality of display elements.

The opposite electrode may have a hole corresponding to the first area.

The encapsulation member may include a glass substrate.

The encapsulation member may include at least one inorganic insulating layer and at least one organic insulating layer.

The display device may further include a reflection-prevention layer disposed on the encapsulation member and including a hole corresponding to the first area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
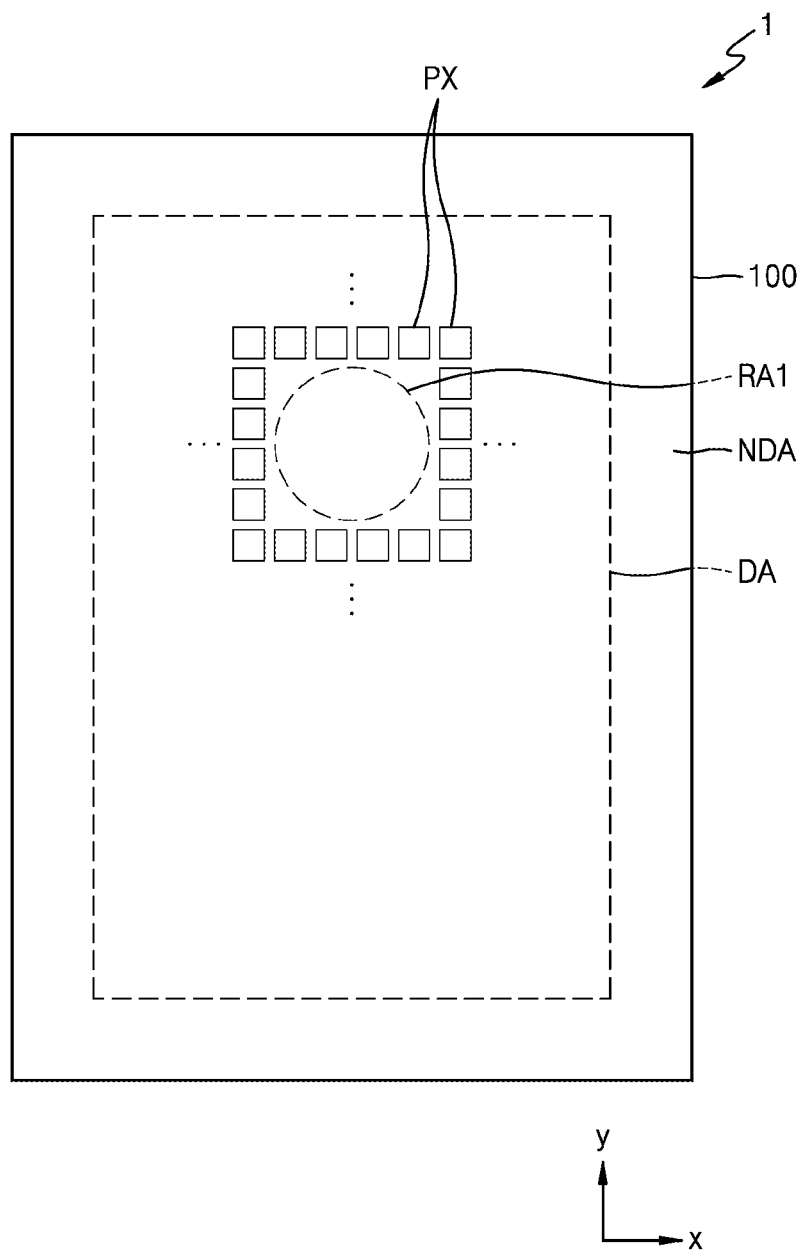
FIG. 1 is a plan view of a portion of a display device according to an embodiment.

The present invention may have various modifications and embodiments, and thus, some of the embodiments will be illustrated in the drawings and described in detail in the detailed description of the invention. The advantages and features of the present invention and methods of achieving the advantages and features will be described more fully with reference to the accompanying drawings, in which exemplary embodiments of the invention are shown. The invention may, however, be embodied in many different forms and should not be construed as being limited to the embodiments set forth herein.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Sizes of elements in the drawings may be exaggerated for convenience of explanation. In other words, since sizes and thicknesses of components in the drawings are arbitrarily illustrated for convenience of explanation, the following embodiments are not limited thereto.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device to be described below is configured to display an image. Hereinafter, for convenience of explanation, embodiments of an organic light-emitting display device will be described. However, the present invention is not limited thereto. For example, the display device may be an inorganic light-emitting display device, or the like.

FIG. 1 is a plan view of a display device 1 according to an embodiment.

Referring to FIG. 1, a substrate 100 of the display device 1 may include a display area DA and a non-display area NDA. The display area DA is an area configured to provide an image (e.g., a predetermined image) and includes pixels PX. Each of the pixels PX may include a display element, such as an organic light-emitting diode (OLED), and the display area DA may be surrounded by the non-display area NDA not including the pixels PX. The non-display area NDA is an area configured not to provide an image. A driver and a wire transmitting an electrical signal or power to be applied to each pixel PX may be in the non-display area NDA. According to an embodiment, at least a portion of the non-display area NDA may be bent or folded toward a rear surface of the display area DA.

A first area RA1 may be on the display area DA and surrounded by the pixels PX. The first area RA1 may be an area configured for additional electronic components for functions of the display device 1, or for additional electronic components which may add new functions to the display device 1. For example, when the display device 1 includes electronic components, such as a camera, a sensor, etc., such electronic components may overlap the first area RA1. The sensor may include a sensor configured to receive and use light such as an infrared sensor, a distance sensor, a fingerprint recognition sensor, etc., but embodiments of the present invention are not limited to these described examples. In the case of the sensor configured to receive and use light, the sensor may receive light in various optical wavelength ranges, such as visible light, infrared light, ultra-violet light, etc. The pixels PX may not be formed in the first area RA1 and the first area RA1 may be surrounded by the pixels PX.

Figure 2:
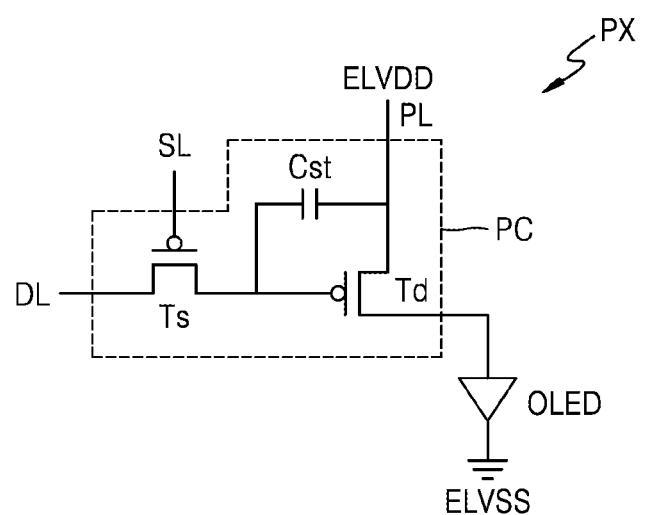
FIG. 2 is an equivalent circuit diagram of a pixel in a display device, according to an embodiment.

FIG. 2 is an equivalent circuit diagram of any one pixel PX of a display device according to an embodiment.

Referring to FIG. 2, the pixel PX may include a pixel circuit PC connected to a scan line SL and a data line DL, and a display element, for example, an OLED, which is connected to the pixel circuit PC.

The pixel circuit PC may include a driving thin film transistor (TFT) Td, a switching TFT Ts, and a storage capacitor Cst. The switching TFT Ts may be connected to the scan line SL and the data line DL, and may transmit a data signal that is input by the data line DL, to the driving TFT Td, based on a scan signal that is input by the scan line SL.

The storage capacitor Cst may be connected to the switching TFT Ts and a driving voltage line PL and may store a voltage corresponding to a difference between a voltage received from the switching TFT Ts and a driving voltage ELVDD that is supplied to the driving voltage line PL.

The driving TFT Td may be connected to the driving voltage line PL and the storage capacitor Cst, and may adjust a driving current flowing from the driving voltage line PL to the OLED, based on a value of the voltage stored in the storage capacitor Cst. The OLED may emit light having predetermined brightness based on the driving current. The OLED may emit, for example, light of red, green, blue, or white. In this specification, it may be understood that the pixel PX refers to a pixel emitting light of any one of red, green, blue, and white, as described above.

As described with reference to FIG. 2, the pixel PX includes two TFTs and one storage capacitor Cst. However, the present invention is not limited thereto. According to another embodiment, the pixel PX may include more than three TFTs and more than two storage capacitors. The design of the pixel circuit PC may be modified in various ways.

Figure 3:
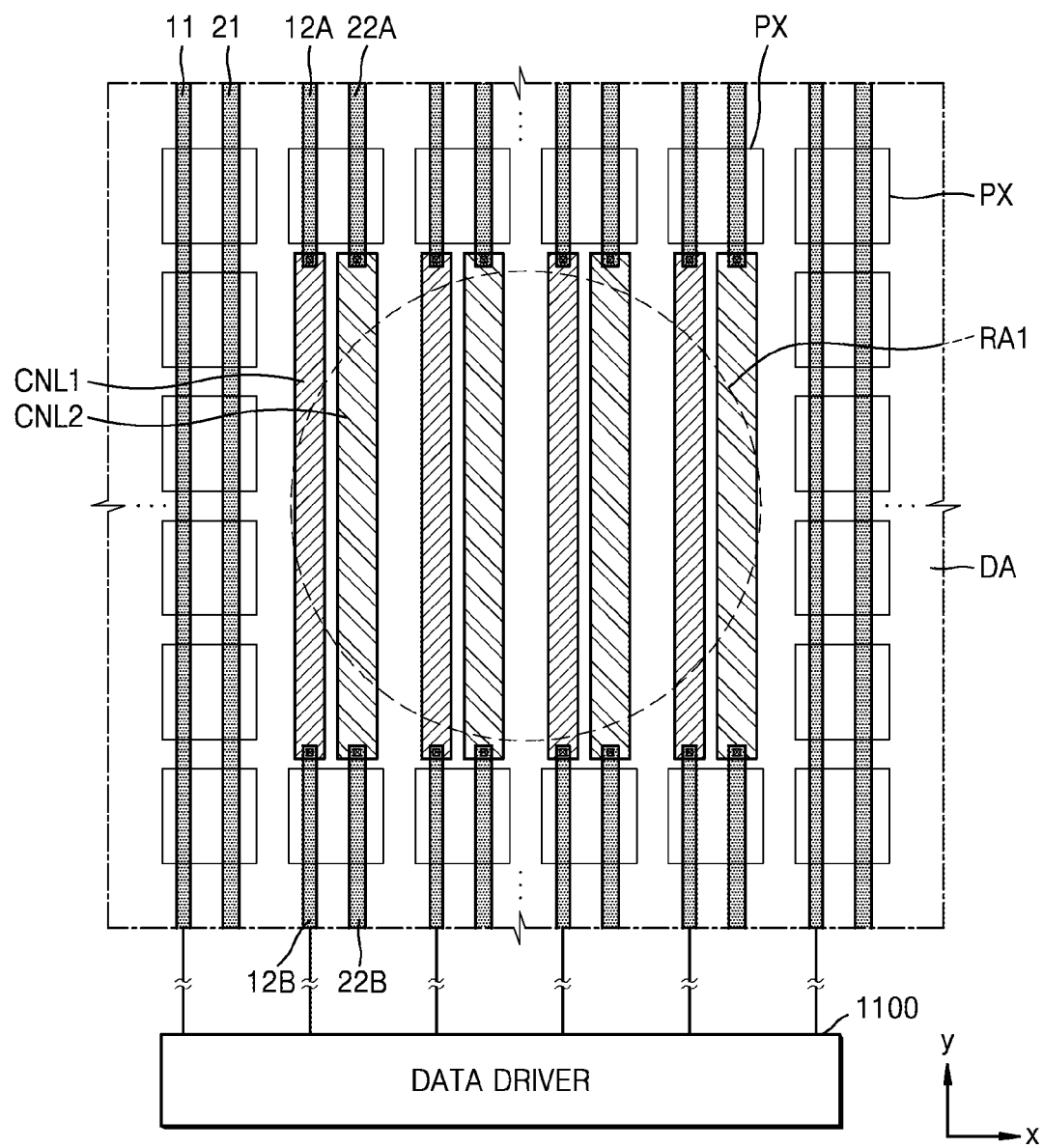
FIG. 3 is a plan view of a portion of a display device according to an embodiment.
Figure 4:
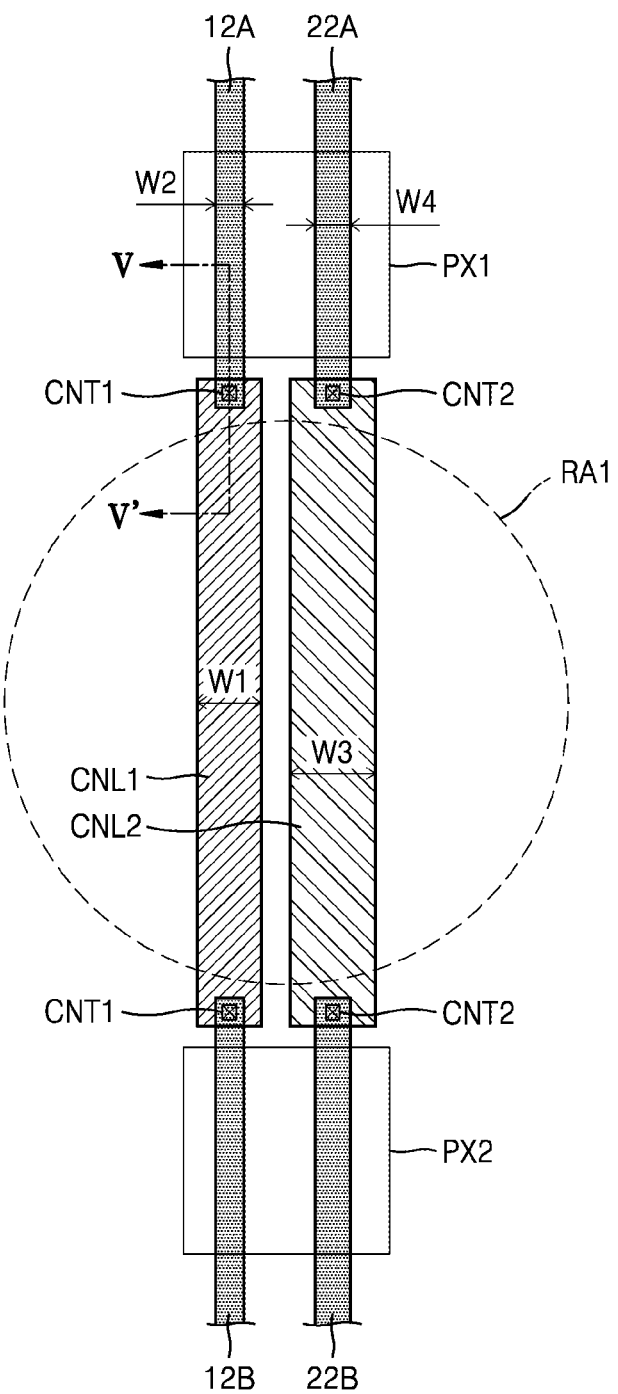
FIG. 4 is a plan view of a portion around a first area of a display device according to an embodiment.
Figure 5:
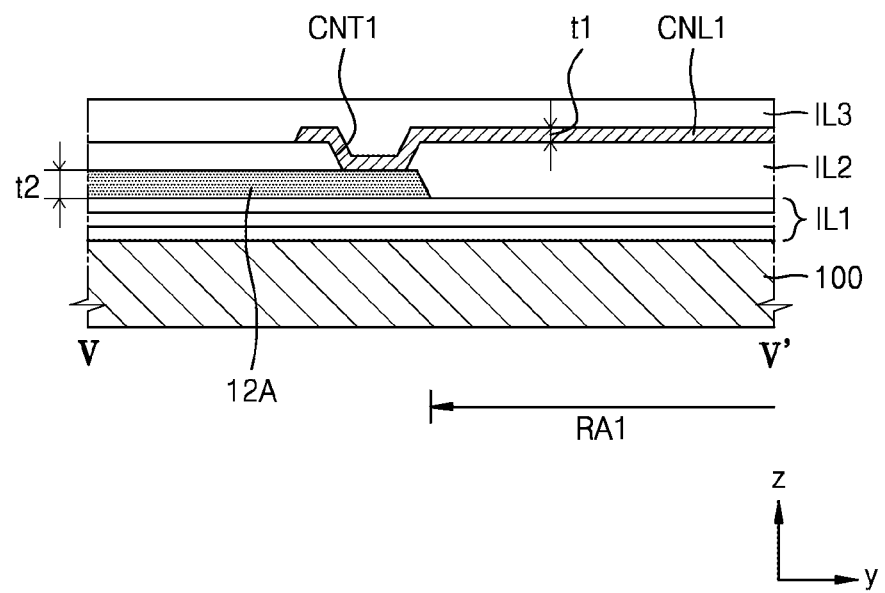
FIG. 5 is a cross-sectional view taken along line V-V' of FIG. 4.

FIG. 3 is a plan view of a portion of a display device according to an embodiment. FIG. 4 is a plan view of a portion around the first area RA1 of a display device according to an embodiment. FIG. 5 is a cross-sectional view taken along a line V-V' of FIG. 4 according to an embodiment.

Referring to FIG. 3, the first area RA1 may be surrounded by the pixels PX. Each pixel PX may include an OLED, and a pixel circuit including a TFT, a storage capacitor, and lines electrically connected to the TFT and the storage capacitor, as described above with reference to FIG. 2. FIG. 3 illustrates data lines 11, 12A, and 12B transmitting data signals to each pixel PX and driving voltage lines 21, 22A, and 22B providing a driving voltage ELVDD.

The data lines 11, 12A, and 12B are electrically connected to a data driver 1100. The data driver 1100 may be a chip on panel (COP) type and disposed on the non-display area NDA (refer to FIG. 1). Alternatively, the data driver 1100 may be a chip on film (COF) type and disposed on a flexible circuit substrate (not shown) electrically connected to a terminal portion (not shown) provided in the non-display area NDA.

In some examples, some of the pixels PX may be at a side (e.g. a left side or a right side in FIG. 3) of the first area RA1 in an x direction. Each of these pixels PX may be arranged to be adjacent to each other in a y direction, and may receive the data signal by the data line 11. Other pixels PX, which are arranged in the y direction and spaced apart from each other with the first area RA1 therebetween, may be electrically connected to the data line 12A or 12B passing each corresponding pixel PX. The data lines 12A and 12B, which are spaced apart from each other in the y direction with the first area RA1 therebetween, may be connected to each other by a first wire (hereinafter, referred to as a first connection wire CNL1).

Some pixels PX (e.g. the pixels PX at the left side or the right side of the first area RA1) may receive the driving voltage ELVDD (refer to FIG. 2) by the driving voltage line 21. Meanwhile, each of the pixels PX, which are arranged in the y direction and spaced apart from each other with the first area RA1 therebetween, may be electrically connected to the driving voltage line 22A or 22B passing each corresponding pixel PX. The driving voltage lines 22A and 22B, which are spaced apart from each other in the y direction with the first area RA1 therebetween, may be connected to each other by a second wire (hereinafter, referred to as a second connection wire CNL2).

The first and second connection wires CNL1 and CNL2 may overlap the first area RA1 and may include a transparent conductive material. In this specification, to be transparent denotes that light is transmitted and may be the same as having light-transmittance. Here, it may be understood that to be "transparent" or to have "light-transmittance" denotes that a transmissivity is equal to or higher than about 70%.

For example, the first and second connection wires CNL1 and CNL2 may include conductive oxide, metal thin films, organic semiconductor materials, or the like. The conductive oxide may include indium tin oxide (ITO), indium zinc oxide (IZO), zinc oxide (ZnO), indium oxide ($In_2O_3$), indium gallium oxide (IGO), aluminum zinc oxide (AZO), or the like. The metal thin films may include Mo, Ti, Mg, Al, Ag, or an alloy thereof.

Hereinafter, for convenience of explanation, any one of the pixels PX which are spatially separated from each other with the first area RA1 therebetween will be referred to as a first pixel PX1, and other of the pixels PX will be referred to as a second pixel PX2. That is, the first and second pixels PX1 and PX2 is spaced apart from each other while the first area RA1 is between the first pixel PX1 and the second pixel PX2. Likewise, any one of the data lines 12A and 12B which are spatially separated from each other with the first area RA1 therebetween, which is connected to the first pixel PX1, will be referred to as a first data line. Other of the data lines 12A and 12B will be referred to as a second data line. That is, the first and second data lines 12A and 12B spaced apart from each other while the first area RA1 is between the first data line 12A and the second data line 12B. Similarly, any one of the driving voltage lines 22A and 22B which are spatially separated from each other with the first area RA1 therebetween, which is connected to the first pixel PX1, will be referred to as a first driving voltage line. Other of the driving voltage lines 22A and 22B will be referred to as a second driving voltage line. That is, the first and second driving voltage lines 22A and 22B spaced apart from each other while the first area RA1 is between the first driving voltage lines 22A and the second driving voltage lines 22B.

Referring to FIG. 4, the first pixel PX1 and the second pixel PX2 may be at opposite sides (for example, an upper side and a lower side in the y direction) of the first area RA1. The first pixel PX1 may be connected to the first data line 12A and the first driving voltage line 22A, and the second pixel PX2 may be connected to the second data line 12B and the second driving voltage line 22B.

The first and second data lines 12A and 12B are spatially separated from each other due to the first area RA1. However, the first and second data lines 12A and 12B may be electrically connected to each other by the first connection wire CNL1. For example, the first and second data lines 12A and 12B may be electrically connected to the first connection wire CNL1 via first contact holes CNT1. Similarly, the first and second driving voltage lines 22A and 22B are spatially separated from each other due to the first area RA1. However, the first and second driving voltage lines 22A and 22B may be electrically connected to each other by the second connection wire CNL2. The first and second driving voltage lines 22A and 22B may be electrically connected to the second connection wire CNL2 via second contact holes CNT2.

Referring to FIG. 5, the first data line 12A and the first connection wire CNL1 may be connected to each other via the first contact hole CNT1 penetrating at least one insulating layer IL2 (hereinafter, referred to as a second insulating layer) interposed between the first data line 12A and the first connection wire CNL1. A first insulating layer IL1 may be between the first data line 12A and the substrate 100, and the first connection wire CNL1 may be covered and protected by a third insulating layer IL3. Each of the first through third insulating layers IL1, IL2, and IL3 may include a single layer or multiple layers including an inorganic insulating material or an organic insulating material. The inorganic insulating material may, for example, include silicon oxide, silicon nitride, silicon oxynitride, etc. The organic insulating material may, for example, include a general-purpose polymer, such as polymethylmethacrylate (PMMA) or polystylene (PS); a polymer derivative having a phenol-based group; an acryl-based polymer; an imide-based polymer; an arylether-based polymer; an amide-based polymer; a fluorine-based polymer; a p-xylene-based polymer; a vinyl-alcohol-based polymer; or a blend thereof.

FIG. 5 illustrates that the first data line 12A is below the second insulating layer IL2, and the first connection wire CNL1 is above the second insulating layer IL2. However, the present invention is not limited thereto. According to another embodiment, the first data line 12A may be above the second insulating layer IL2 and the first connection wire CNL1 may be below the second insulting layer IL2. FIG. 5 illustrates that the first data line 12A and the first connection wire CNL1 directly in contact with each other via the first contact hole CNT1. However, the present invention is not limited thereto. According to another embodiment, the first data line 12A and the first connection wire CNL1 may be electrically connected to each other by a conductive layer(s) interposed therebetween. For example, the first data line 12A and the conductive layer(s) may contact each other and the conductive layer(s) and the first connection wire CNL1 may contact each other. In this case, an insulating layer having a contact hole may be interposed between the first data line 12A and the conductive layer(s) and between the first connection wire CNL1 and the conductive layer(s).

Until now, the structure between the first data line 12A and the first connection wire CNL1 has been described with reference to FIG. 5. However, the above description may also be applied to a structure between the second data line 12B and the first connection wire CNL1, a structure between the first driving voltage line 22A and the second connection wire CNL2, and a structure between the second driving voltage line 22B and the second connection wire CNL2.

Referring to FIG. 4 again, a width W1 of the first connection wire CNL1 overlapping the first area RA1 may be greater than a width W2 of the first and second data lines 12A and 12B. Similarly, a width W3 of the second connection wire CNL2 overlapping the first area RA1 may be greater than a width W4 of the first and second driving voltage lines 22A and 22B. Since the first area RA1 does not include an OLED emitting light of a predetermined color, it is possible to make full use of the area, and thus the width W1 of the first connection wire CNL1 and the width W3 of the second connection wire CNL2 may be greater than the width W2 of the first and second data lines 12A and 12B and the width W4 of the first and second driving voltage lines 22A and 22B, respectively. According to an embodiment, the width W1 of the first connection wire CNL1 may be about two to three times greater than the width W2 of the first and second data lines W2, and the width W3 of the second connection wire CNL2 may be about two to three times greater than the width W4 of the first and second driving voltage lines 22A and 22B.

A thickness of the first connection wire CNL1 and a thickness of the second connection wire CNL2 may be less than a thickness of the first and second data lines 12A and 12B and a thickness of the first and second driving voltage lines 22A and 22B, respectively, and thus, a transmissivity of the first and second connection wires CNL1 and CNL2 may be increased. FIG. 5 illustrates that a thickness t1 of the first connection wire CNL1 is less than a thickness t2 of the first data line 12A. According to an embodiment, when the widths W1 and W3 of the first connection wire CNL1 and the second connection wire CNL2 are relatively greater while the thicknesses of the first connection wire CNL1 and the second connection wire CNL2 are relatively less, the first and second connection wires CNL1 and CNL2 may have reduced resistance and increased light-transmittance.

Figure 6:
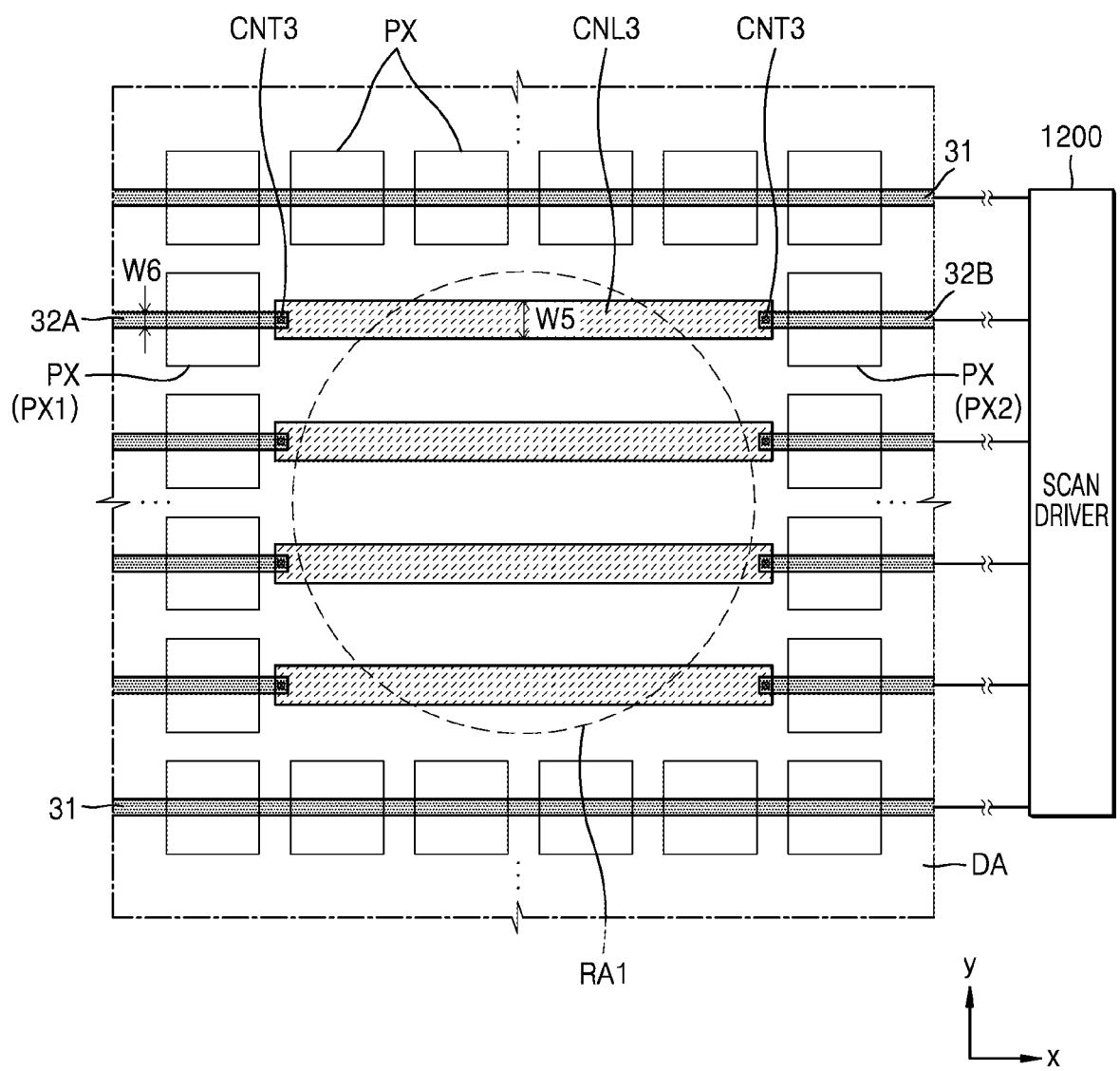
FIG. 6 is a plan view of a portion of a display device according to another embodiment.

FIG. 6 is a plan view of a portion of a display device according to another embodiment.

Referring to FIG. 6, the first area RA1 may be surrounded by the pixels PX, and each of the pixels PX may include an OLED, and a pixel circuit including a TFT, a storage capacitor, and lines electrically connected to the TFT and the storage capacitor, as described above with reference to FIG. 2. FIG. 6 illustrates scan lines 31, 32A, and 32B transmitting scan signals to each pixel PX.

The scan lines 31, 32A, and 32B may be electrically connected to a scan driver 1200. The scan driver 1200 may be disposed in the non-display area NDA (refer to FIG. 1).

Some pixels, for example, the pixels PX disposed at a side (for example, an upper side or a lower side in FIG. 6) of the first area RA1, may receive a scan signal by the scan line 31. However, other pixels, for example, the pixels PX spaced apart from each other with the first area RA1 therebetween, may be electrically connected to the scan line 32A or 32B crossing each corresponding pixel PX. The scan lines 32A and 32B may be spaced apart from each other with the first area RA1 therebetween, and be connected to each other by a third wire (hereinafter, referred to as a third connection wire CNL3).

The third connection wire CNL3 may overlap the first area RA1 and may have light-transmittance. The third connection wire CNL3 may include a material having light-transmittance and conductivity. For example, the third connection wire CNL3 may include a transparent conductive oxide, such as ITO, IZO, ZnO, In$_2$O$_3$, IGO, AZO, or the like, may include a light-transmissive metal thin film, such as Mo, Ti, Mg, Al, Ag, or an alloy thereof, or may include a transparent organic semiconductor material.

Hereinafter, for convenience of explanation, any one of the pixels PX spaced apart from each other with the first area RA1 therebetween will be referred to as a first pixel PX1, and the other one will be referred to as a second pixel PX2. Also, any one of the scan lines 32A and 32B spaced apart from each other with the first area RA1 therebetween, which is connected to the first pixel PX1, will be referred to as a first scan line 32A, and the other one, which is connected to the second pixel PX2, will be referred to as a second scan line 32B.

The first and second scan lines 32A and 32B are spatially separated from each other due to the first area RA1. However, the first and second scan lines 32A and 32B may be electrically connected to each other by the third connection wire CNL3. According to an embodiment, the first and second scan lines 32A and 32B may be electrically connected to each other via a third contact hole CNT3 penetrating at least one insulating layer interposed between the first and second scan lines 32A and 32B. According to another embodiment, the first and second scan lines 32A and 32B may be connected to the third connection wire CNL3 by a conductive layer(s) between the first and second scan lines 32A and 32B, and the third connection wire CNL3. For example, the first and second scan lines 32A and 32B may contact the conductive layer(s) and the conductive layer(s) may contact the third connection wire CNL3.

A width W5 of the third connection wire CNL3 may be greater than a width W6 of the first and second scan lines 32A and 32B. Since the first area RA1 does not include an OLED emitting light of a predetermined color, the width W5 of the third connection wire CNL3 may be about two to three times greater than the width W6 of the first and second scan lines 32A and 32B.

A thickness of the third connection wire CNL3 may be less than a thickness of the first and second scan lines 32A and 32B, and thus, a transmissivity of the third connection wire CNL3 may be increased. According to an embodiment, when the third connection wire CNL3 has the relatively great width W5 and the relatively less thickness, resistance of the third connection wire CNL3 may be reduced and light-transmittance of the third connection wire CNL3 may be increased.

Until now, descriptions have been separately given, with respect to the embodiment (refer to FIGS. 3 through 5) in which the first and second data lines 12A and 12B are connected to each other and the first and second driving voltage lines 22A and 22B are connected to each other by the first and second connection wires CNL1 and CNL2, respectively, which overlap the first area RA1, and an embodiment (refer to FIG. 6) in which the first and second scan lines 32A and 32B are connected to each other by the third connection wire CNL3. However, the present invention is not limited thereto.

Figure 7:
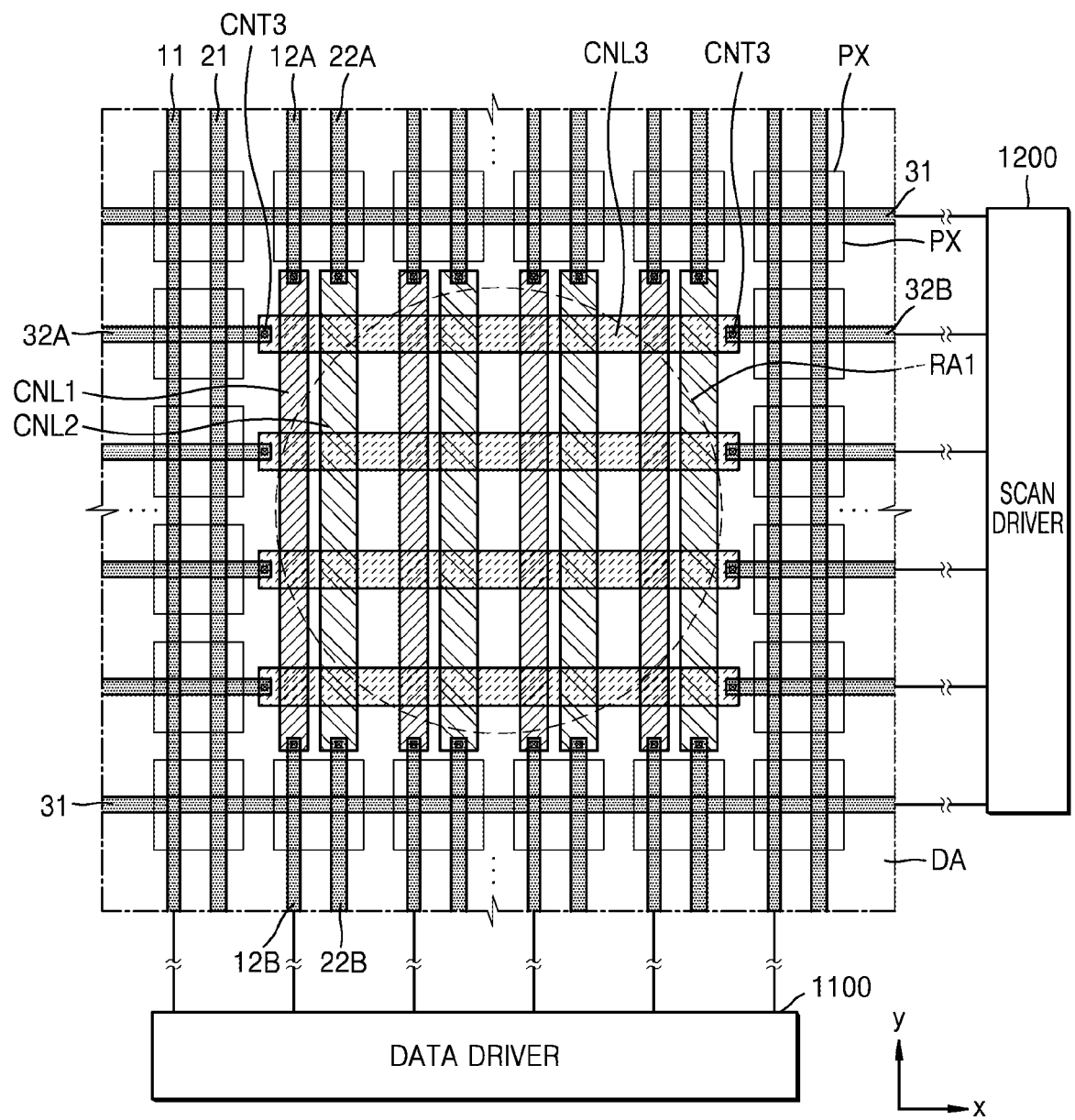
FIG. 7 is a plan view of a portion of a display device according to another embodiment.

According to another embodiment, as illustrated in FIG. 7, a display device may include all of the first through third connection wires CNL1, CNL2, and CNL3 overlapping the first area RA1. FIG. 7 is a plan view of a portion of the display device according to another embodiment, and a detailed structure illustrated in FIG. 7 is the same as the structure illustrated in FIGS. 3 through 6.

According to another embodiment, the display device may include the first and third connection wires CNL1 and CNL3 overlapping the first area RA1. Alternatively, the display device may include the second and third connection wires CNL2 and CNL3 overlapping the first area RA1.

Figure 8:
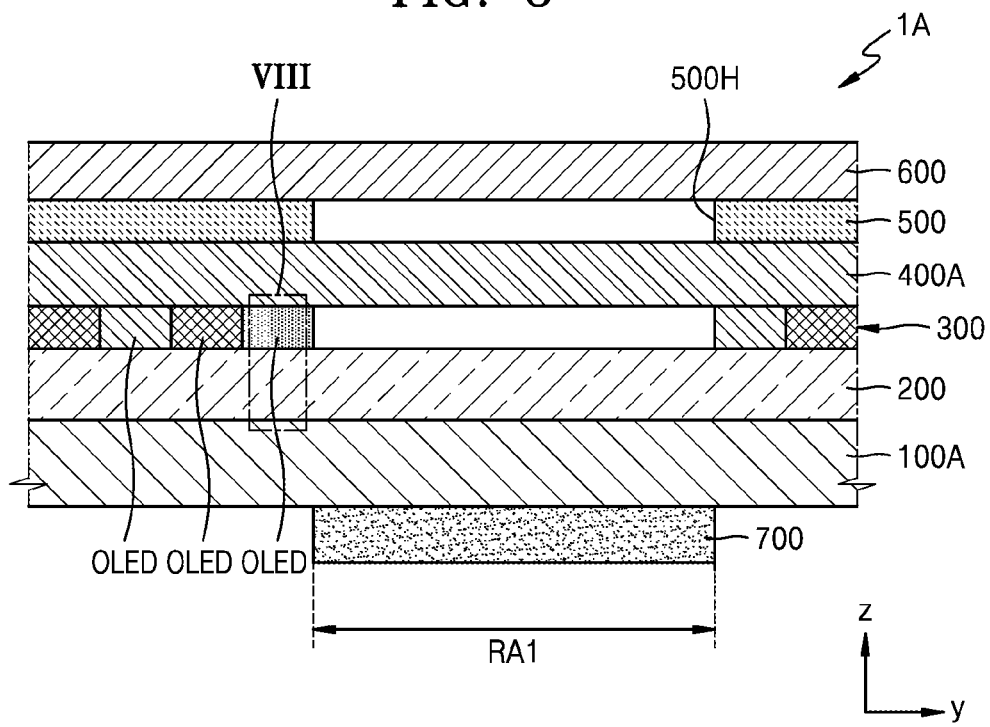
FIG. 8 is a cross-sectional view of a display device according to another embodiment.
Figure 9:
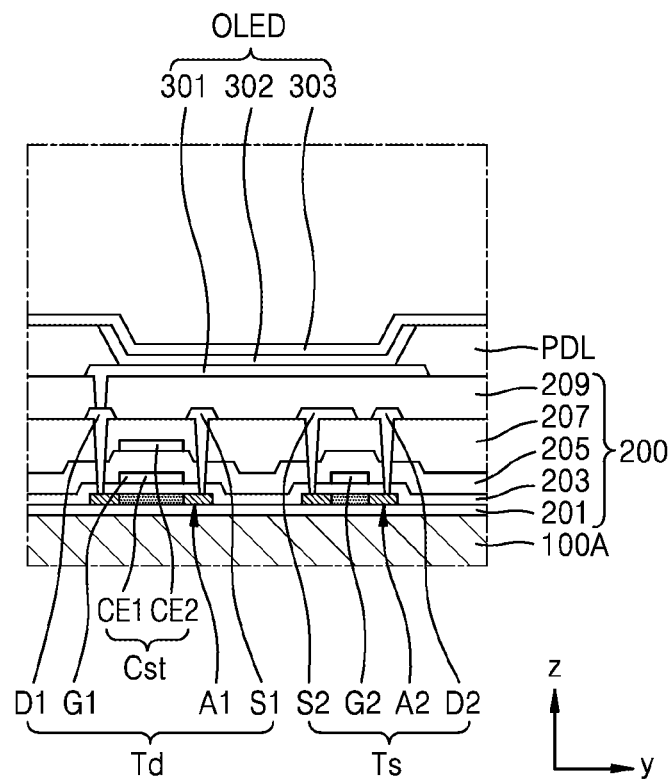
FIG. 9 is a cross-sectional view of portion VIII of FIG. 8.

FIG. 8 is a cross-sectional view of a display device 1A according to another embodiment, and FIG. 9 is a cross-sectional view of a portion VIII of FIG. 8.

Referring to FIG. 8, the display device 1A may include a substrate 100A, a circuit layer 200, an array 300 of OLEDs, an encapsulation member 400A, and a reflection prevention layer 500, and a window member 600 may be on the reflection prevention layer 500.

The substrate 100A may include a rigid glass material. The circuit layer 200 including a TFT and lines electrically connected to the TFT may be on the substrate 100A. The TFT and the lines of the circuit layer 200 may be electrically connected to the OLEDs.

Referring to FIG. 9, the circuit layer 200 may include the driving TFT Td and the switching TFT Ts, the storage capacitor Cst, the lines, and the insulating layers interposed therebetween, as described above with reference to FIG. 2. Hereinafter, descriptions will be given in an order in which components are stacked.

A buffer layer 201 may reduce or block penetration of a foreign material, wetness, or an external body from a lower portion of the substrate 100A, and may provide a flat surface on the substrate 100A. The buffer layer 201 may include an inorganic insulating material, such as oxide or nitride.

The driving TFT Td may include a driving semiconductor layer A1, a driving gate electrode G1, a driving source electrode S1, and a driving drain electrode D1. The switching TFT Ts may include a switching semiconductor layer A2, a switching gate electrode G2, a switching source electrode S2, and a switching drain electrode D2. FIG. 9 illustrates an example in which the gate electrodes G1 and G2 of the driving and switching TFTs Ts and Td are top-gate types disposed on the semiconductor layers A1 and A2, but the present invention is not limited thereto. According to another embodiment, the driving and switching TFTs Td and Ts may be bottom-gate types.

A gate insulating layer 203 may be interposed between the driving semiconductor layer A1 and the driving gate electrode G1, and between the switching semiconductor layer A2 and the switching gate electrode G2. The gate insulting layer 203 may include an inorganic insulating material including oxide or nitride.

The storage capacitor Cst may include a first electrode CE1 and a second electrode CE2 overlapping each other, and a first interlayer insulating layer 205 may be interposed between the first electrode CE1 and the second electrode CE2. FIG. 9 illustrates a case in which the storage capacitor Cst overlaps the driving TFT Td, and the first electrode CE1 of the storage capacitor Cst is the driving gate electrode G1 of the driving TFT Td. However, the present invention is not limited thereto. The storage capacitor Cst may be disposed in another area of the substrate 100A, so as not to overlap the driving TFT Td.

The storage capacitor Cst may be covered by a second interlayer insulating layer 207. The first and second interlayer insulating layers 205 and 207 may include an inorganic insulating material including oxide or nitride. The driving and switching TFTs Td and Ts and the storage capacitor Cst may be covered by a planarization layer 209 including an organic insulating material, etc.

A pixel electrode 301 may be electrically connected to the TFT, for example, the driving TFT Td, via a hole of the planarization layer 209. The pixel electrode 301 may be a reflection electrode, and may include Ag, Mg, Al, Pt, Pd, Au, Ni, Nd, Ir, Cr, or a compound thereof.

The pixel electrode 301 may be exposed via an opening of a pixel-defining layer PDL. The pixel-defining layer PDL may have the opening to expose at least a central region of the pixel-electrode 301, and thus, may define a pixel. The pixel-defining layer PDL may cover an edge of the pixel electrode 301. The pixel-defining layer PDL may prevent an arc from being generated at an end of the pixel electrode 301 and an opposite electrode 303 by increasing a distance between the edge of the pixel electrode 301 and the opposite electrode 303. The pixel-defining layer PDL may include an organic material, such as polyimide (PI) or hexamethyldisiloxane (HMDSO).

An emission layer 302 may include a low molecular weight material or a high molecular weight material. Although not shown, a function layer may further be provided above or below the emission layer 302. The function layer may include at least one of a hole injection layer (HIL), a hole transport layer (HTL), an electron transport layer (ETL), and/or an electron injection layer (EIL).

The opposite electrode 303 may be disposed to cover the emission layer 302 and may be a light-transmissive electrode having light-transmittance. The opposite electrode 303 may include a metal thin film having a low work function and including Li, Ca, LiF/Ca, LiF/Al, Al, Ag, Mg, or a compound thereof. Alternatively, the opposite electrode 303 may include a light-transmissive conductive layer, such as ITO, IZO, ZnO, $In_2O_3$, IGO, or AZO. Alternatively, the opposite electrode 303 may have a multi-layered structure in which the described light-transmissive conductive layer is stacked on the described metal thin film. According to an embodiment, the opposite electrode 303 may include a metal thin film including Ag and Mg.

Referring to FIG. 8 again, the array 300 on the circuit layer 200 may include the OLEDs, and each OLED may have the structure described above with reference to FIG. 9. The plurality of OLEDs may be arranged around the first area RA1, with the first area RA1 therebetween. Each OLED may correspond to each pixel, and thus, the OLEDs illustrated in FIG. 8 may be arranged around the first area RA1 so as to surround the first area RA1, like the pixels described above with reference to FIGS. 3 and 6. The OLEDs are not disposed in the first area RA1.

Lines (for example, at least one of data lines, driving voltage lines, or scan lines) connected to each of the OLEDs spaced apart from each other with the first area RA1 therebetween may be provided in the circuit layer 200. The lines are spatially separated from each other with the first area RA1 therebetween. Thus, as described above with reference to FIGS. 3 through 6, the lines may be electrically connected to each other by the first through third connection wires CNL1, CNL2, and CNL3. The first through third connection wires CNL1, CNL2, and CNL3 may be provided in the circuit layer 200 of the display device 1A. Descriptions with respect to the OLEDs and the lines which are spaced apart from each other with the first area RA1 therebetween, and the connection wires are the same as the descriptions given above with reference to FIGS. 3 through 6.

The encapsulation member 400A may be disposed to cover the array 300. The encapsulation member 400A may include, for example, a glass substrate. The encapsulation member 400A may be sealed with the substrate 100A, with the circuit layer 200 and the array 300 of the OLEDs between the encapsulation member 400A and the substrate 100A. For example, a sealing member surrounding the array 300 may be interposed between the substrate 100A and the encapsulation member 400A.

The reflection prevention layer 500 may prevent light that is incident from the outside of the display device 1A toward the display device 1A from being reflected from an interface between layers included in the display device 1A and being visible to the outside. The reflection prevention layer 500 may include a polarizer. Alternatively, the reflection prevention layer 500 may include an optical layer including a color filter and a black matrix instead of the polarizer. The reflection prevention layer 500 may include a hole 500H corresponding to the first area RA1. When the hole (or open area) 500H is formed in the reflection prevention layer 500, a transmissivity of the display device 1A corresponding to the first area RA1 may be increased.

An additional electronic component 700 which may improve the function of the display device 1A or add a new function to the display device 1A may be disposed in the first area RA1. The electronic component 700 may include a camera, a sensor, or the like. The electronic component 700 may be disposed at a rear surface of the substrate 100A.

In a portion (or an area) of the display device 1A corresponding the first area RA1, the circuit layer 200 may include the first through third connection wires CNL1, CNL2, and CNL3 having light-transmittance as described in FIGS. 3 through 6, and the array 300 may not include the OLEDs. Thus, the electronic component 700, such as a camera or a sensor, may perform an operation, such as photographing an image or receiving external light, by the portion of the display device 1A corresponding to the first area RA1.

Figure 10:
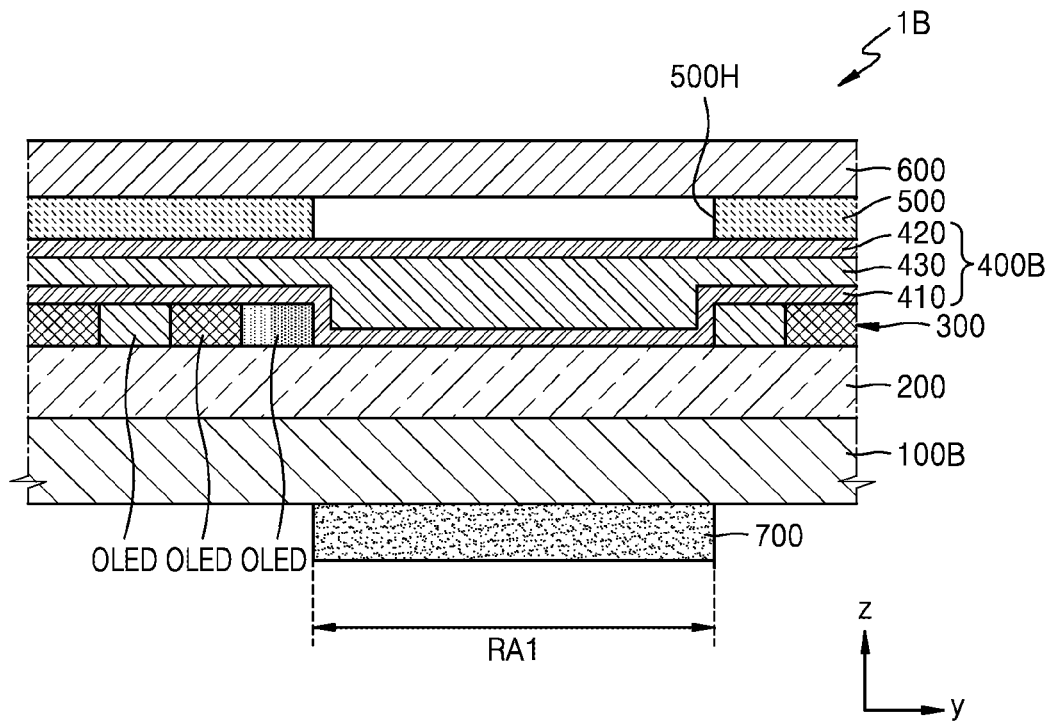
FIG. 10 is a schematic cross-sectional view of a display device according to another embodiment.

FIG. 10 is a schematic cross-sectional view of a display device 1B according to another embodiment.

The display device 1B of FIG. 10 may include a substrate 100B, the circuit layer 200, the array 300, an encapsulation member 400B, the reflection prevention layer 500, and the window member 600. Detailed structures of the circuit layer 200, the array 300, the reflection prevention layer 500, the window member 600, and the display element of the display device 1B are the same as those of the display device 1A described above with reference to FIGS. 8 and 9. Also, as described above with reference to FIGS. 3 through 6, in the display device 1B of FIG. 10, pixels (or display elements) are disposed to be spaced apart from each other based on the first area RA1, and lines (for example, data lines, driving voltage lines, and scan lines) connected to the pixels spaced apart from each other are also spaced apart from each other based on the first area RA1 and are electrically connected to each other by connection wires (for example, first through third connection wires) overlapping the first area RA1. Hereinafter, differences are mainly described.

The substrate 100B may include various materials having flexible or bendable properties. For example, the substrate 100B may include polymer resins, such as polyethersulphone (PES), polyacrylate (PAR), polyetherimide (PEI), polyethylenen naphthalate (PEN), polyethylenen terephthalate (PET), polyphenylene sulfide (PPS), polyarylate, PI, polycarbonate (PC), and cellulose acetate propionate (CAP). The substrate 100B may include a single layer or multiple layers including the materials described above, and when the substrate 100B includes multiple layers, the substrate 100B may further include an inorganic layer (not shown).

The encapsulation member 400B may include at least one inorganic encapsulation layer and at least one organic encapsulation layer. FIG. 10 illustrates that the encapsulation member 400B includes a first inorganic encapsulation layer 410, a second inorganic encapsulation layer 420, and an organic encapsulation layer 430 between the first inorganic encapsulation layer 410 and the second inorganic encapsulation layer 420. The first and second inorganic encapsulation layers 410 and 420 may include silicon oxide, silicon nitride, and/or silicon oxynitride, and the organic encapsulation layer 430 may include one or more materials selected from the group consisting of PET, PEN, PC, PI, polyethylene sulfonate, polyoxymethylene, polyarylate, and HMDSO. However, the present invention is not limited thereto.

FIG. 10 illustrates that the first and second inorganic encapsulation layers 410 and 420 and the organic encapsulation layer 430 are stacked on the first area RA1. However, the present invention is not limited thereto. According to another embodiment, the organic encapsulation layer 430 may include an area corresponding to the first area RA1. The area of the organic encapsulation layer 430 is formed by removing or not disposing an organic encapsulation material. For example, during a process of manufacturing the organic encapsulation layer 430 by using a monomer, a flow of the monomer may be adjusted or a structure, etc. may be used, in order for the organic encapsulation material not to be located on the first area RA1.

Figure 11A:
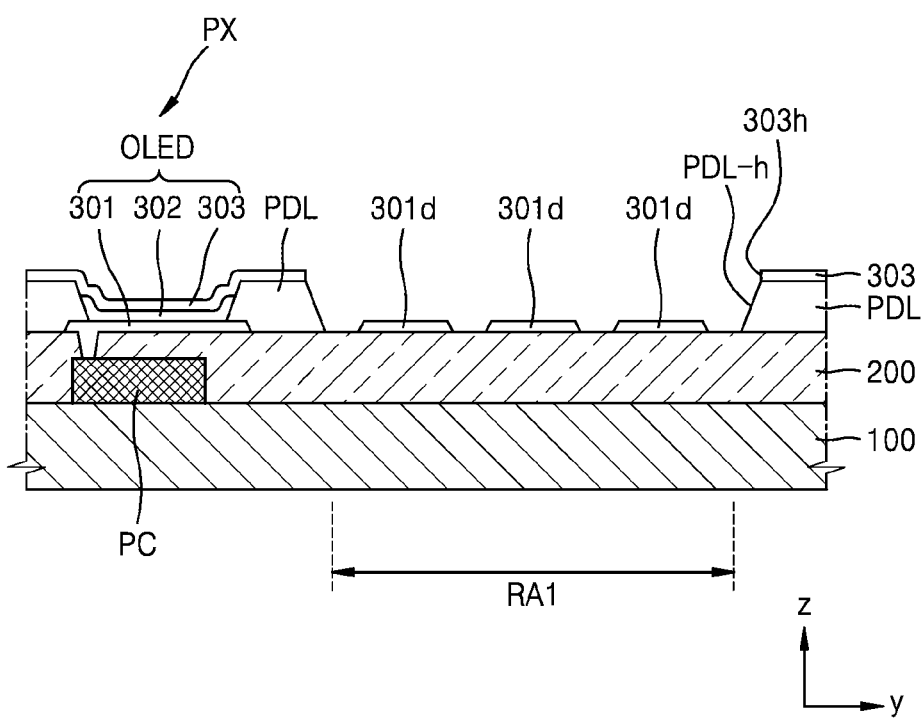
FIGS. 11A through 11C are cross-sectional views of a display device according to embodiments, corresponding to a first area.
Figure 11B:
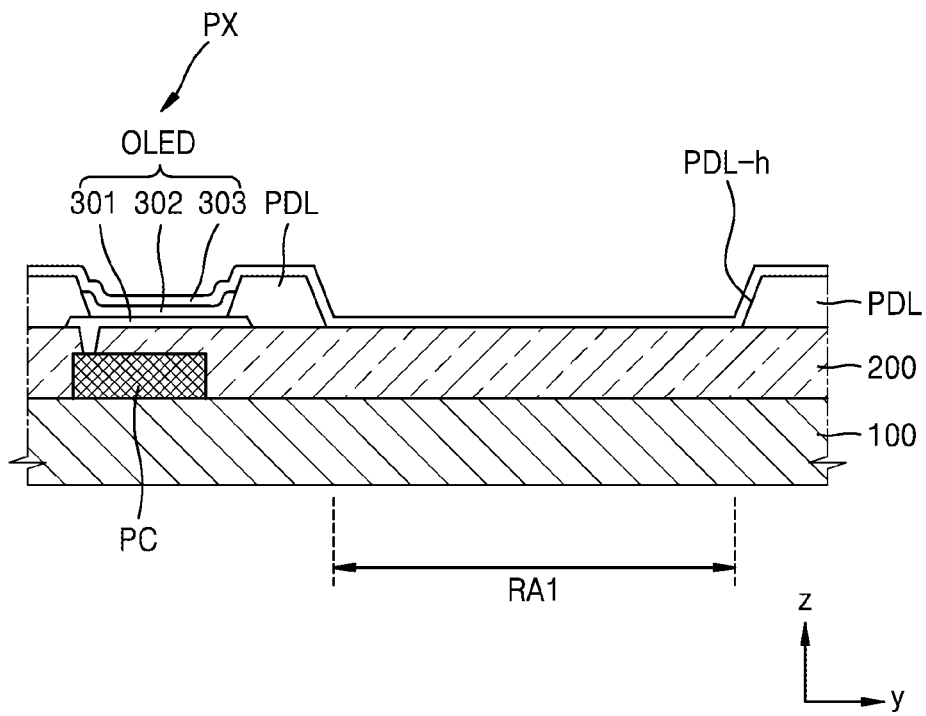
Figure 11C:
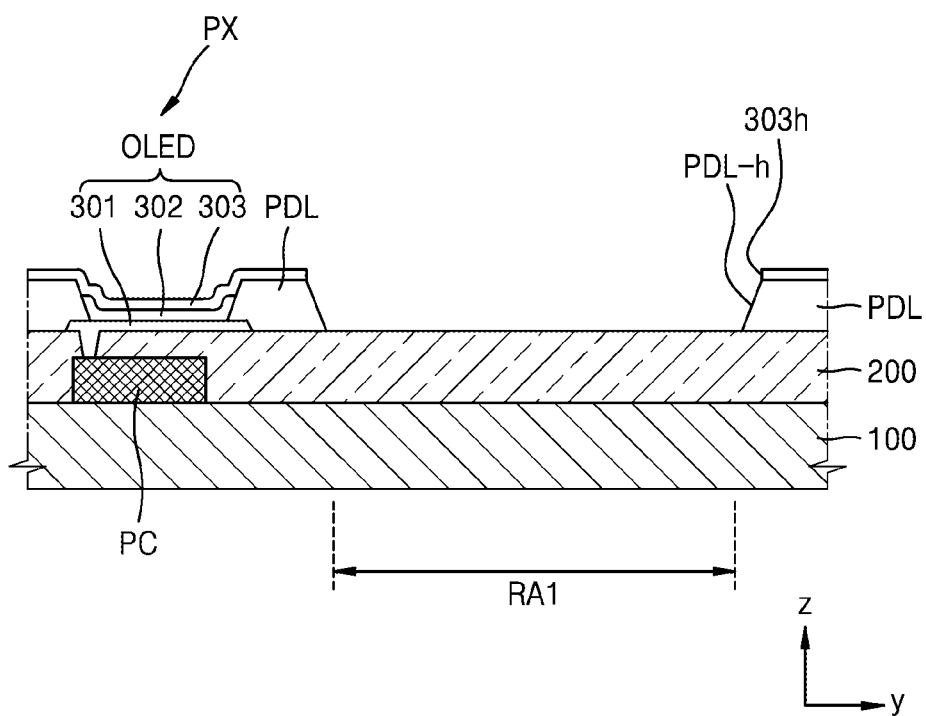

FIGS. 11A through 11C are cross-sectional views based on the first area RA1 of a display device according to embodiments. For convenience, the encapsulation members 400A and 400B, the reflection prevention layer 500, and the window member 600, described with reference to FIGS. 8 and 10, are not illustrated.

Referring to FIGS. 11A through 11C, the pixel PX is disposed to be adjacent to the first area RA1. The pixel PX may include the OLED as the display element, and the pixel circuit PC electrically connected to the OLED may be disposed on the circuit layer 200. The OLED may include the pixel electrode 301 on the circuit layer 200, the pixel-defining layer PDL disposed on the pixel electrode 301 and having an opening to expose a central region of the pixel electrode 301, the emission layer 302 on the pixel electrode 301 exposed through the opening, and the opposite electrode 303 on the emission layer 302. Light of colors may be generated when excitons, which are formed by a combination of holes and electrons, decay to a ground state from an exited state.

The first area RA1 has light transmittance in order for the electronic component 700 (refer to FIGS. 8 and 10) to receive light. The emission layer 302 may not be in the first area RA1 unlike the pixel PX. The pixel-defining layer PDL may not be in the first area RA1. For example, the pixel-defining layer PDL may include a hole PDL-h corresponding to the first area RA1.

In the first area RA1, any one of a pixel electrode 301d and the opposite electrode 303 may be disposed (refer to FIGS. 11A and 11B), or both of the pixel electrode 301d and the opposite electrode 303 may not be disposed (refer to FIG. 11C). In FIG. 11A, the pixel electrode 301d may correspond to a dummy pixel electrode.

Figure 12:
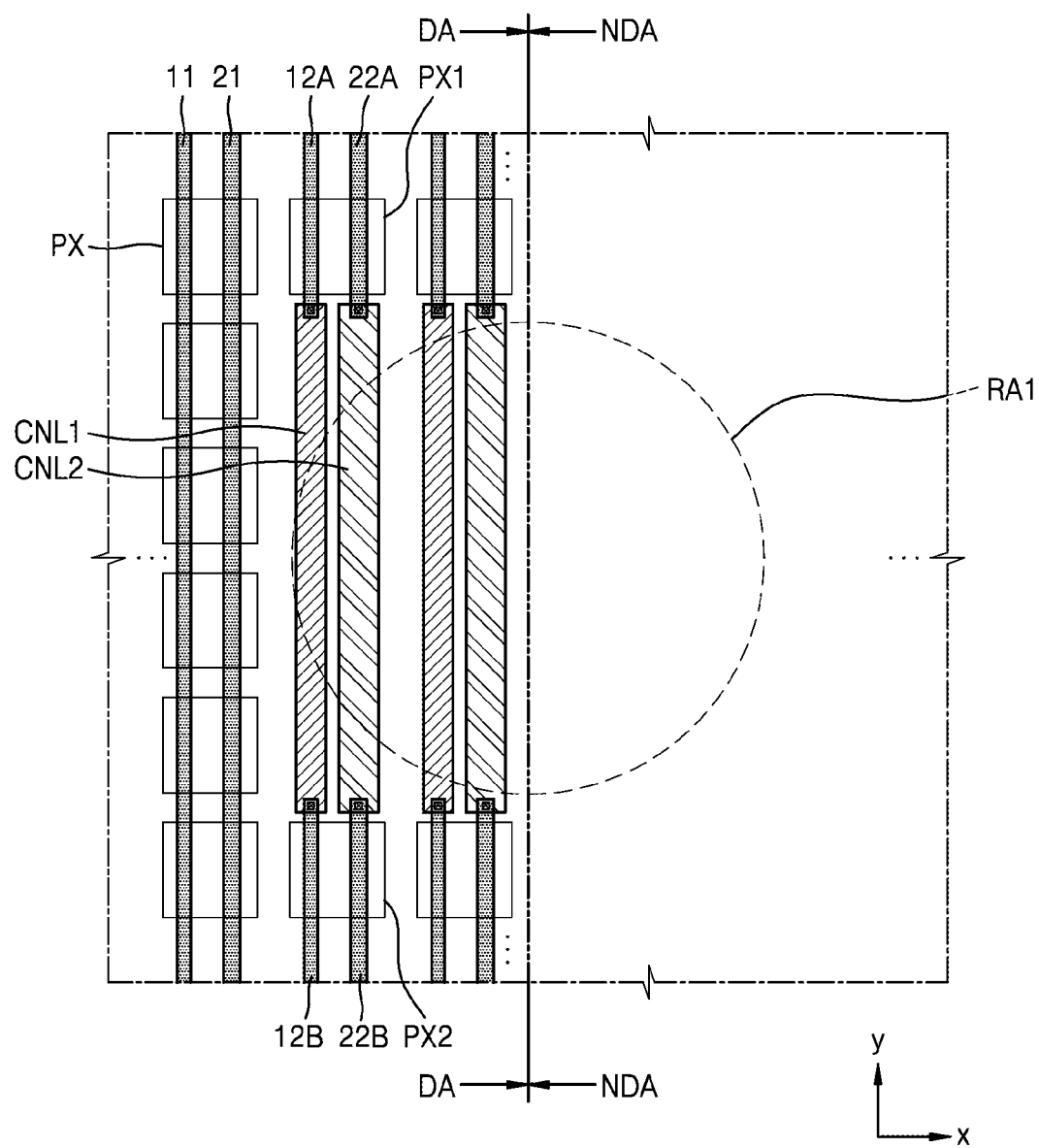
FIG. 12 is a plan view of a portion of a display device according to another embodiment.
Figure 13:
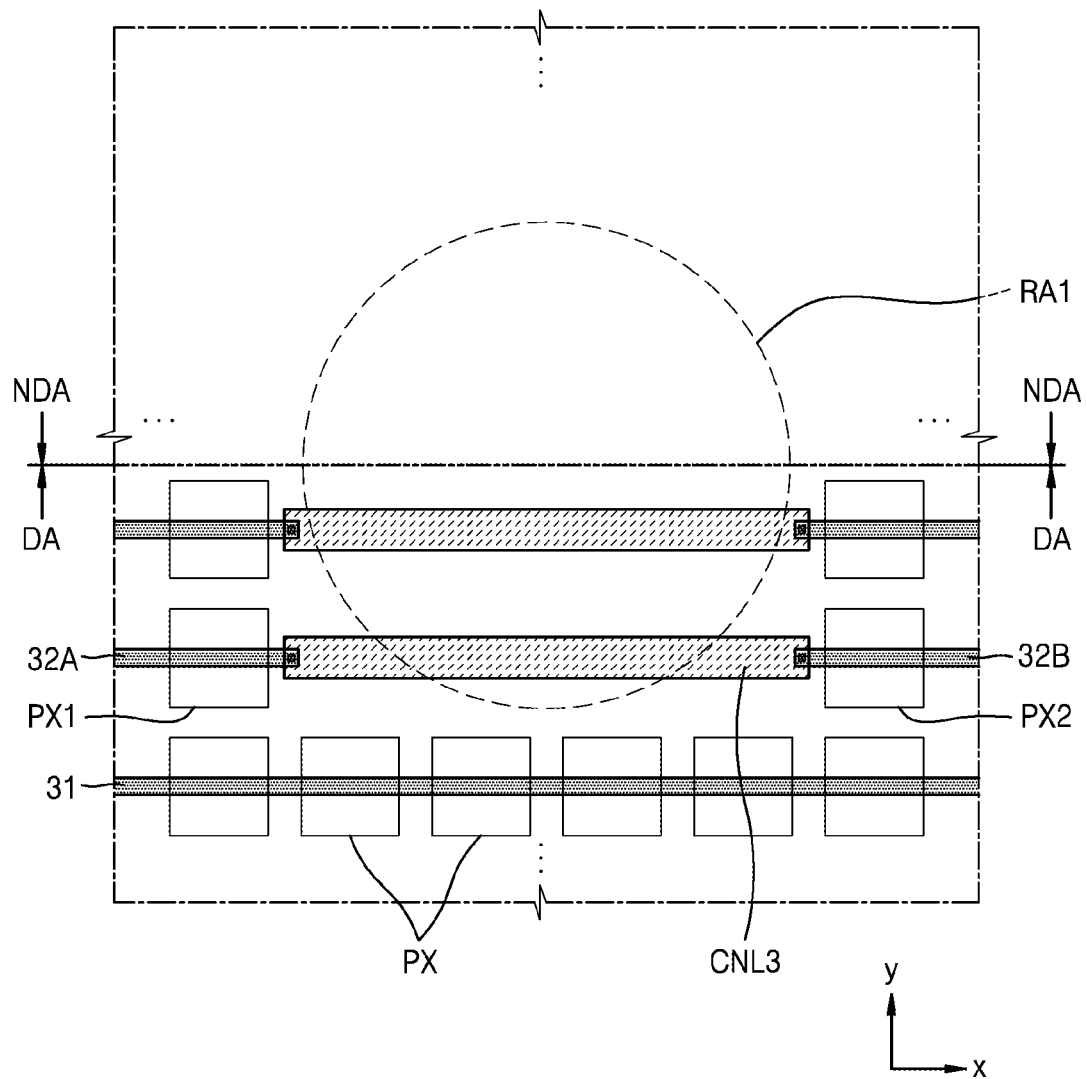
FIG. 13 is a plan view of a portion of a display device according to another embodiment.

FIGS. 12 and 13 are plan views of a portion of a display device according to another embodiment.

As described above, the pixels PX are arranged to entirely surround the first area RA1 (FIGS. 1 through 6). However, the present invention is not limited thereto. Referring to FIGS. 12 and 13, the pixels PX may partially surround the first area RA1, and the first area RA1 may be disposed between the display area DA and the non-display area NDA.

Referring to FIG. 12, the pixels PX may be disposed at a left side (or a right side) of the first area RA1 and may partially surround the first area RA1.

Some pixels PX, for example, a column of the pixels PX, which are by the first area RA1 and arranged to be adjacent to each other in a direction y, may receive a data signal by the data line 11 and a driving voltage by the driving voltage line 21. However, other pixels PX, for example, the first and second pixels PX1 and PX2 spaced apart from each other with the first area RA1 therebetween, may be connected to the first and second data lines 12A and 12B and the first and second driving voltage lines 22A and 22B, respectively. The first and second data lines 12A and 12B are disconnected from each other with the first area RA1 therebetween, and connected to each other by the first connection wire CNL1 overlapping the first area RA1. The first and second driving voltage lines 22A and 22B are disconnected from each other with the first area RA1 therebetween and connected to each other by the second connection wire CNL2, as described above with reference to FIGS. 3 through 5.

Referring to FIG. 13, the pixels PX may be disposed at a lower side (or an upper side) of the first area RA1 and may partially surround the first area RA1.

Some pixels PX, for example, a column of the pixels PX, which are disposed by the first area RA1 and arranged to be adjacent to each other in the x direction, may receive a scan signal by the scan line 31. However, other pixels PX, for example, the first and second pixels PX1 and PX2 spaced apart from each other with the first area RA1 therebetween, may be connected to the first and second scan lines 32A and 32B. The first and second scan lines 32A and 32B are disconnected from each other with the first area RA1 therebetween and connected to each other by the third connection wire CNL3 overlapping the first area RA1, as described above with reference to FIGS. 3 through 5.

As described above, according to the one or more of the above embodiments, the first area RA1, in which a camera, etc. may be mounted, may be located in the display area DA. Furthermore, since lines (for example, data lines, etc.) disconnected by the first area RA1 are electrically connected by the connection wire, and the connection wire overlaps the first area RA1, the lines need not be curved in order to circumvent the first area RA1.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate;
a plurality of pixels on the substrate, the plurality of pixels being adjacent to a first area and at least partially surrounding the first area;
a light-transmissive wire on the substrate and overlapping the first area; and
an encapsulation member covering the plurality of pixels, wherein:
the plurality of pixels comprise a first pixel and a second pixel spaced apart from each other with the first area therebetween,
the first pixel comprises a first thin film transistor (TFT) and a first line connected to the first TFT, and the second pixel comprises a second TFT and a second line connected to the second TFT,
the light-transmissive wire electrically connects the first line with the second line,
the pixels comprise an opposite electrode that is formed as one body so as to correspond to the pixels, and
the opposite electrode has a hole corresponding to the first area.

2. The display device of claim 1, further comprising:
at least one insulating layer interposed between the first line and the light-transmissive wire,
wherein the first line and the light-transmissive wire are connected to each other via a contact hole penetrating the at least one insulating layer.

3. The display device of claim 1, wherein a thickness of the light-transmissive wire is less than a thickness of at least one of the first line or the second line.

4. The display device of claim 1, wherein a width of the light-transmissive wire is greater than a width of at least one of the first line or the second line.

5. The display device of claim 1, wherein the first line is selected from a scan line, a data line, and a driving voltage line, and the second line is selected from a scan line, a data line, and a driving voltage line.

6. The display device of claim 1, wherein the encapsulation member includes a glass substrate.

7. The display device of claim 1, wherein the encapsulation member includes at least one inorganic insulating layer and at least one organic insulating layer.

8. A display device comprising:
a substrate;
a circuit layer on the substrate and comprising a plurality of thin film transistors (TFTs) and a plurality of lines electrically connected to the plurality of TFTs;
an array including a plurality of display elements, wherein the array is on the circuit layer; and
an encapsulation member covering the array,
wherein the array includes a first area, and the plurality of display elements are adjacent to the first area so as to at least partially surround the first area, and
the circuit layer includes a wire overlapping the first area, wherein the wire is light-transmissive,
wherein the plurality of display elements comprise a first display element and a second display element spaced apart from each other with the first area therebetween,
the wire electrically connects a first line electrically connected to the first display element with a second line electrically connected to the second display element,
wherein the plurality of display elements comprise an opposite electrode that is formed as one body so as to correspond to the plurality of display elements, and
wherein the opposite electrode has a hole corresponding to the first area.

9. The display device of claim 8, wherein a thickness of the wire is less than a thickness of at least one of the first line or the second line.

10. The display device of claim 9, wherein a width of the wire is greater than a width of at least one of the first line or the second line.

11. The display device of claim 8, wherein each of the plurality of display elements further comprises:
a pixel electrode on the circuit layer;
a pixel-defining layer having an opening exposing the pixel electrode; and
an emission layer on the pixel electrode,
wherein the opposite electrode is on the emission layer.

12. The display device of claim 11, wherein the pixel-defining layer has a hole corresponding to the first area.

13. The display device of claim 8, wherein the encapsulation member includes a glass substrate.

14. The display device of claim 8, wherein the encapsulation member includes at least one inorganic insulating layer and at least one organic insulating layer.

15. The display device of claim 8, further comprising a reflection-prevention layer on the encapsulation member, wherein the reflection-prevention layer includes a hole corresponding to the first area.

* * * * *